United States Patent
Fan et al.

(10) Patent No.: US 10,950,322 B2
(45) Date of Patent: Mar. 16, 2021

(54) SHIFT REGISTER UNIT CIRCUIT, METHOD OF DRIVING THE SAME, GATE DRIVE CIRCUIT, AND DISPLAY APPARATUS

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Jun Fan, Beijing (CN); Jie Zhang, Beijing (CN); Jiguo Wang, Beijing (CN); Fuqiang Li, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 36 days.

(21) Appl. No.: 15/752,790

(22) PCT Filed: Sep. 4, 2017

(86) PCT No.: PCT/CN2017/100367
§ 371 (c)(1),
(2) Date: Feb. 14, 2018

(87) PCT Pub. No.: WO2018/126723
PCT Pub. Date: Jul. 12, 2018

(65) Prior Publication Data
US 2019/0006018 A1    Jan. 3, 2019

(30) Foreign Application Priority Data
Jan. 9, 2017    (CN) .......................... 201710012865.3

(51) Int. Cl.
*G11C 19/28* (2006.01)
*G09G 3/20* (2006.01)

(52) U.S. Cl.
CPC ............. *G11C 19/287* (2013.01); *G09G 3/20* (2013.01); *G09G 2300/0426* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

2008/0055225 A1* 3/2008 Pak ...................... G09G 3/3677
345/96
2011/0273417 A1 11/2011 Shin et al.
(Continued)

FOREIGN PATENT DOCUMENTS

CN    101312019 A    11/2008
CN    102237031 A    11/2011
(Continued)

OTHER PUBLICATIONS

Office Action received for Chinese Patent Application No. 201710012865.3, dated Dec. 21, 2017, 17 pages (9 pages of English Translation and 8 pages of Office Action).
(Continued)

*Primary Examiner* — Andre L Matthews
(74) *Attorney, Agent, or Firm* — Womble Bond Dickinson (US) LLP

(57) ABSTRACT

A shift register unit circuit is disclosed that includes a first node control circuit, a second node control circuit, and a plurality of output circuits. Each of the plurality of output circuits is connected to a respective output terminal and provides a gate drive signal to the respective output terminal.
(Continued)

Also disclosed are a method of driving the shift register unit circuit, a gate drive circuit, and a display apparatus.

10 Claims, 9 Drawing Sheets

(56) References Cited

U.S. PATENT DOCUMENTS

| | | |
|---|---|---|
| 2015/0077319 A1 | 3/2015 | Yao et al. |
| 2017/0039971 A1 | 2/2017 | Huang |
| 2017/0330526 A1 | 11/2017 | Fan et al. |
| 2017/0358267 A1 | 12/2017 | Feng et al. |

FOREIGN PATENT DOCUMENTS

| | | | |
|---|---|---|---|
| CN | 103345941 | A | 10/2013 |
| CN | 104299583 | A | 1/2015 |
| CN | 104700805 | A | 6/2015 |
| CN | 105047228 | A | 11/2015 |
| CN | 105096865 | A | 11/2015 |
| CN | 105096889 | A | 11/2015 |
| CN | 106601175 | A | 4/2017 |
| KR | 10-2015-0002030 | A | 1/2015 |

OTHER PUBLICATIONS

International Search Report received for PCT Patent Application No. PCT/CN2017/100367, dated Nov. 28, 2017, 8 pages (3 pages of English Translation and 5 pages of Original Document).

\* cited by examiner

US 10,950,322 B2

SHIFT REGISTER UNIT CIRCUIT, METHOD OF DRIVING THE SAME, GATE DRIVE CIRCUIT, AND DISPLAY APPARATUS

CROSS-REFERENCE TO RELATED APPLICATIONS

The present application is the U.S. national phase entry of PCT/CN2017/100367, with an international filing date of Sep. 4, 2017, which claims the benefit of Chinese Patent Application No. 201710012865.3, filed on Jan. 9, 2017, the entire disclosures of which are incorporated herein by reference.

TECHNICAL FIELD

This disclosure relates to generation of gate drive signals, and more particularly to a shift register unit circuit, a method of driving the shift register unit circuit, a gate drive circuit, and a display apparatus.

BACKGROUND

A shift register including a plurality of cascaded shift register unit circuits may operate as a gate drive circuit to provide gate drive signals to a pixel array in a display panel. As the display apparatus (e.g., a mobile phone, a tablet, or the like) becomes lighter and thinner, there is a need for an ever narrower screen bezel. With a conventional gate drive circuit, a shift register unit circuit can generate only one gate drive signal to drive one row of pixels. Therefore, a large number of shift register unit circuits have to be provided for the display panel, especially those having a high resolution, thus occupying the bezel area. This is disadvantageous for a narrow bezel.

SUMMARY

It would be advantageous to provide a shift register unit circuit that may alleviate, mitigate or eliminate one or more of the problems described above.

According to an aspect of the present disclosure, a shift register unit circuit is provided comprising: a first node control circuit configured to supply an active potential from a first scan level terminal to a first node in response to an input pulse from an input terminal being active, to supply an inactive potential from a second scan level terminal to the first node in response to a reset pulse from a reset terminal being active, and to supply an inactive potential from a first reference level terminal to the first node in response to a second node being at an active potential; a second node control circuit configured to supply an inactive potential from the first reference level terminal to the second node in response to the first node being at an active potential, and to set the second node at an active potential in response to the first node being at an inactive potential and a reset hold signal from a reset hold terminal being active; and N output circuits each connected to a respective internal node, a respective clock terminal and a respective output terminal, the respective internal node being electrically connected to the first node, N being an integer greater than or equal to 2. Each of the N output circuits is configured to supply a clock signal from the respective clock terminal to the respective output terminal in response to the respective internal node being at an active potential, to supply an inactive potential from the first reference level terminal to the respective output terminal in response to the second node being at an active potential, and to cause a change in the potential of the respective internal node in response to a change in the potential of the respective output terminal.

In some embodiments, each of the N output circuits comprises: a first transfer transistor having a gate connected to the respective internal node, a first electrode connected to the respective output terminal, and a second electrode connected to the respective clock terminal; a second transfer transistor having a gate connected to the second node, a first electrode connected to the first reference level terminal, and a second electrode connected to the respective output terminal; and an output capacitor connected between the respective internal node and the respective output terminal.

In some embodiments, the first node control circuit comprises: a first transistor having a gate connected to the input terminal, a first electrode connected to the first node, and a second electrode connected to the first scan level terminal; a second transistor having a gate connected to the reset terminal, a first electrode connected to the second scan level terminal, and a second electrode connected to the first node; and a third transistor having a gate connected to the second node, a first electrode connected to the first node, and a second electrode connected to the first reference level terminal.

In some embodiments, the second node control circuit comprises: a fourth transistor having a gate connected to the first node, a first electrode connected to the first reference level terminal, and a second electrode connected to the second node; a fifth transistor having a gate connected to the reset hold terminal, a first electrode connected to the reset hold terminal, and a second electrode connected to the second node; and a first capacitor connected between the second node and the first reference level terminal.

In some embodiments, the internal node of each of the N output circuits is directly connected to the first node.

In some embodiments, the shift register unit circuit further comprises N third transfer transistors each having a gate connected to a second reference level terminal for supplying an active potential, a first electrode connected to the first node, and a second electrode connected to the internal node of a respective one of the N output circuits.

According to another aspect of the present disclosure, a method of driving the shift register unit circuit as described above is provided. The method comprises: supplying an active potential from the first scan level terminal to the first node in response to an input pulse from the input terminal being active such that the respective internal nodes are at an active potential; supplying clock signals from the respective clock terminals to the respective output terminals in response to the respective internal nodes being at an active potential, wherein a change in the potential of each of the respective internal nodes is caused in response to a change in the potential of each of the respective output terminals; supplying an inactive potential from the second scan level terminal to the first node in response to a reset pulse from the reset terminal being active; setting the second node at an active potential in response to the first node being at an inactive potential and a reset hold signal from the reset hold terminal being active; and supplying an inactive potential from the first reference level terminal to the respective output terminals in response to the second node being at an active potential.

In some embodiments, the method further comprises supplying, respectively, N different clock signals having a same period and a duty cycle of 1/(2N) to the respective clock terminals of the N output circuits. An n-th one of the N clock signals is delayed by 1/(2N) of the period with respect to an (n−1)-th one of the N clock signals, n being an integer and 1<n≤N.

In some embodiments, the method further comprises supplying an identical clock signal to the respective clock terminals of the N output circuits.

According to yet another aspect of the present disclosure, a gate drive circuit is provided comprising a plurality of cascaded shift register unit circuits as described above. Except for a first one of the plurality of shift register unit circuits, the input terminal of each of the plurality of shift register unit circuits is connected to a last one of the N output terminals of an adjacent previous one of the shift register unit circuits. Except for a last one of the plurality of shift register unit circuits, the reset terminal of each of the plurality of shift register unit circuits is connected to a first one of the N output terminals of an adjacent next one of the shift register unit circuits. The N clock terminals of a (2k−1)-th one of the plurality of shift register unit circuits are configured to receive respective clock signals from a first group of clock lines including N clock lines, k being a positive integer. The N clock terminals of a 2k-th one of the plurality of shift register unit circuits are configured to receive respective clock signals from a second group of clock lines including N clock lines, the clock signals supplied by the first and second groups of clock lines having a same period, each of the clock signals supplied by the second group of clock lines being delayed by 1/N of the period with respect to a corresponding one of the clock signals supplied by the first group of clock lines.

According to still yet another aspect of the present disclosure, a display apparatus is provided comprising the gate drive circuit as described above.

These and other aspects of the present disclosure will be apparent from and elucidated with reference to the embodiment(s) described hereinafter.

DETAILED DESCRIPTION

It will be understood that, although the terms first, second, third etc. may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to" or "coupled to" another element, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings.

Figure 1:
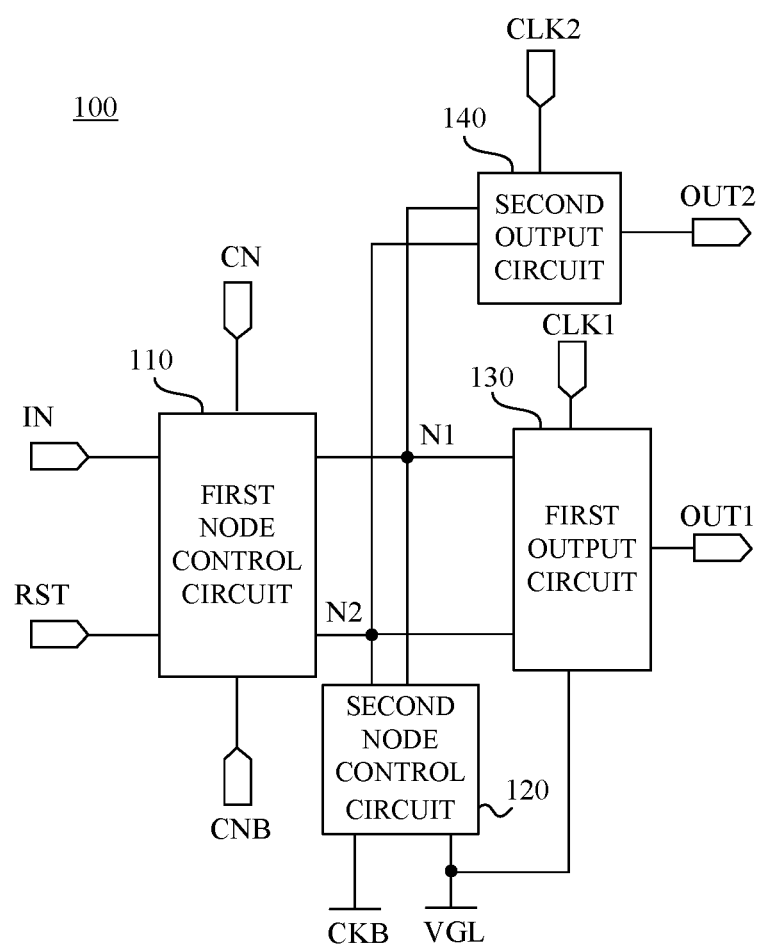
FIG. 1 is a block diagram of a shift register unit circuit according to an embodiment of the present disclosure.

FIG. 1 is a block diagram of a shift register unit circuit 100 according to an embodiment of the present disclosure. Referring to FIG. 1, the shift register unit circuit 100 includes a first node control circuit 110, a second node control circuit 120, and at least two output circuits. For ease of illustration and description, only a first output circuit 130 and a second output circuit 140 are shown in FIG. 1.

The first node control circuit 110 is configured to supply an active potential from a first scan level terminal CN to a first node N1 in response to an input pulse from an input terminal IN being active. The first node control circuit 110 is further configured to supply an inactive potential from a second scan level terminal CNB to the first node N1 in response to a reset pulse from a reset terminal RST being active. The first node control circuit 110 is further configured to supply an inactive potential from a first reference level terminal VGL to the first node N1 in response to a second node N2 being at an active potential.

The second node control circuit 120 is configured to supply an inactive potential from the first reference level terminal VGL to the second node N2 in response to the first node N1 being at an active potential. The second node control circuit 120 is further configured to set the second node N2 at an active potential in response to the first node N1 being at an inactive potential and a reset hold signal from a reset hold terminal CKB being active.

The first output circuit 130 is connected to an internal node ND1 (not shown in FIG. 1), a clock terminal CLK1, and an output terminal OUT1. The internal node ND1 is electrically connected to the first node N1. The first output circuit 130 is configured to supply a clock signal from a clock terminal CLK1 to the output terminal OUT1 in response to the internal node ND1 being at an active potential. The first output circuit 130 is further configured to supply an inactive potential from the first reference level terminal VGL to the output terminal OUT1 in response to the second node N2 being at an active potential. The first output circuit 130 is further configured to cause a change in the potential of the internal node ND1 in response to a change in the potential of the output terminal OUT1.

The second output circuit 140 is connected to an internal node ND2 (not shown in FIG. 1), a clock terminal CLK2, and an output terminal OUT2. The second output circuit 140 is configured to operate similarly to the first output circuit 130, the description of which is thus omitted here for the sake of conciseness.

The term "active potential" as used herein refers to a potential at which a circuit element involved (e.g., a transistor) is enabled. In contrast, the term "inactive potential" refers to a potential at which the circuit element involved is disabled. For an n-type transistor, the active potential is high and the inactive potential is low. For a p-type transistor, the active potential is low and the inactive is high.

Figure 2:
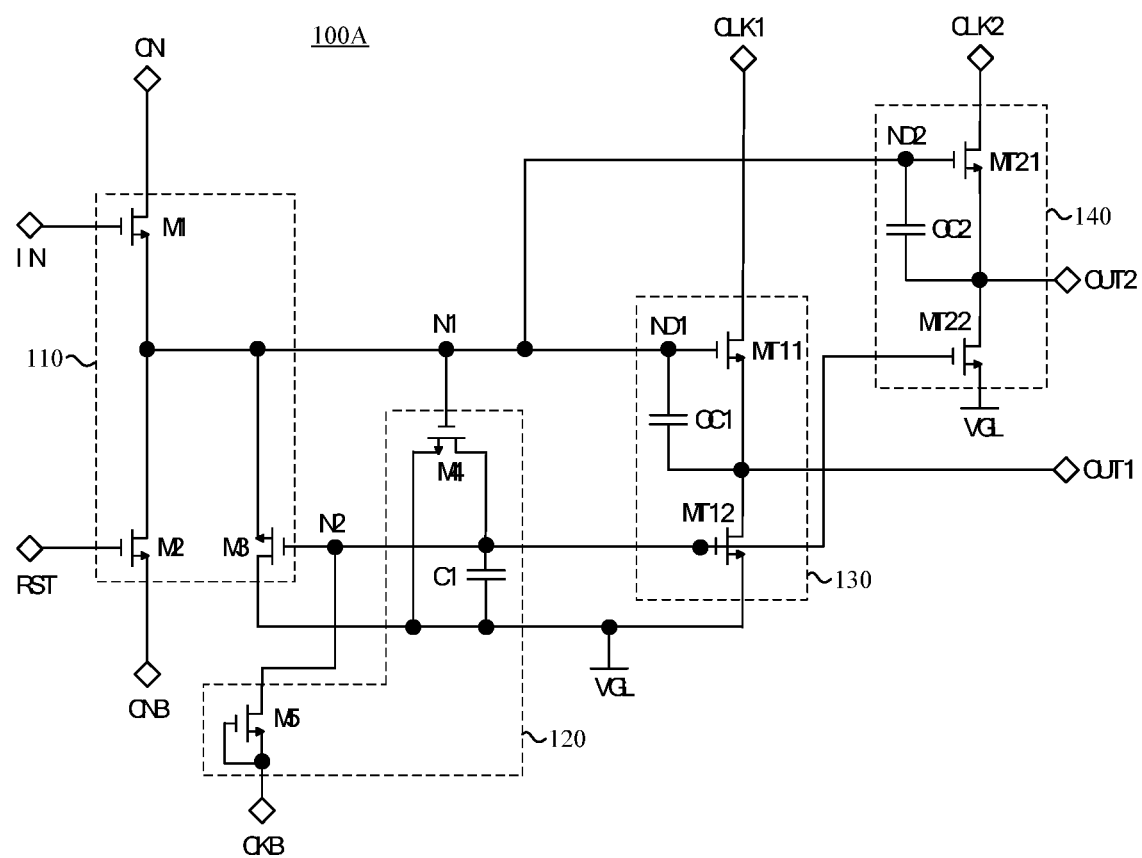
FIG. 2 is a circuit diagram of an example circuit of the shift register unit circuit as shown in FIG. 1.

FIG. 2 is a circuit diagram of an example circuit 100A of the shift register unit circuit 100 as shown in FIG. 1. An example configuration of the shift register unit circuit 100 is described below in conjunction with FIG. 2.

The first node control circuit 110 includes a first transistor M1, a second transistor M2, and a third transistor M3. The first transistor M1 has a gate connected to the input terminal IN, a first electrode connected to the first node N1, and a second electrode connected to the first scan level terminal CN. The second transistor M2 has a gate connected to the reset terminal RST, a first electrode connected to the second scan level terminal CNB, and a second electrode connected to the first node N1. The third transistor M3 has a gate connected to the second node N2, a first electrode connected to the first node N1, and a second electrode connected to the first reference level terminal VGL.

The second node control circuit 120 includes a fourth transistor M4, a fifth transistor M5, and a first capacitor C1. The fourth transistor M4 has a gate connected to the first node N1, a first electrode connected to the first reference level terminal VGL, and a second electrode connected to the second node N2. The fifth transistor M5 has a gate connected to the reset hold terminal CKB, a first electrode connected to the reset hold terminal CKB, and a second electrode connected to the second node N2. The first capacitor C1 is connected between the second node N2 and the first reference level terminal VGL.

The first output circuit 130 includes its own first transfer transistor MT11, second transfer transistor MT12, and output capacitor OC1. The first transfer transistor MT11 has a gate connected to the internal node ND1, a first electrode connected to an output terminal OUT1, and a second electrode connected to the clock terminal CLK1. The second transfer transistor MT12 has a gate connected to the second node N2, a first electrode connected to the first reference level terminal VGL, and a second electrode connected to the output terminal OUT1. The output capacitor OC1 is connected between the internal node ND1 and the output terminal OUT1.

The second output circuit 140 has the same configuration as the first output circuit 130. Specifically, as shown in FIG. 2, the first output circuit 130 includes its own first transfer transistor MT21, second transfer transistor MT22, and output capacitor OC2.

In the example circuit 100A, the internal nodes ND1 and ND2 of the first and second output circuits 130 and 140 are directly connected to the first node N1. Therefore, the potential of each of the internal nodes ND1 and ND2 is equal to the potential of the first node N1 at any time.

Figure 3:
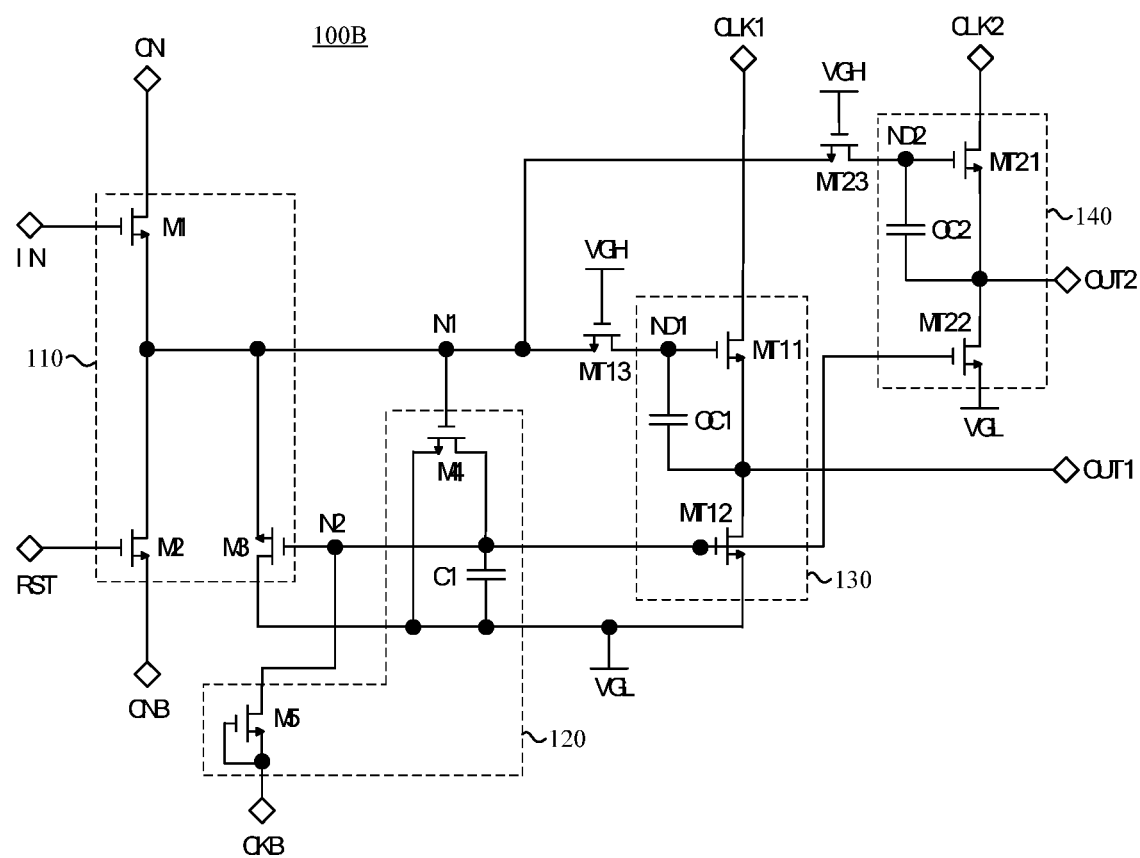
FIG. 3 is a circuit diagram of another example circuit of the shift register unit circuit as shown in FIG. 1.

FIG. 3 is a circuit diagram of another example circuit 100B of the shift register unit circuit 100 as shown in FIG. 1. In the example circuit 100B, the configurations of the first node control circuit 110, the second node control circuit 120, the first output circuit 130, and the second output circuit 140 are the same as those described above with reference to FIG. 2, and thus are omitted here for conciseness.

The example circuit 100B differs from the example circuit 100A of FIG. 2 in that the internal nodes ND1 and ND2 of the first and second output circuits 130 and 140 are now connected to the first node N1 through respective third transfer transistors MT13 and MT23. As shown in FIG. 3, the third transfer transistor MT13 has a gate connected to a second reference level terminal VGH for supplying an active potential, a first electrode connected to the first node N1, and a second electrode connected to the internal node ND1. Similarly, the third transfer transistor MT23 has a gate connected to the second reference level terminal VGH for supplying an active potential, a first electrode connected to the first node N1, and a second electrode connected to the internal node ND2.

The addition of the third transfer transistors MT13 and MT23 may be advantageous. Specifically, when the potentials of the output terminals OUT1 and OUT2 are changed from an inactive potential (a low level in the example of FIG. 3) to an active potential (a high level in the example of FIG. 3), the potentials of the internal nodes ND1 and ND2 are increased due to a self-boosting effect of the output capacitors OC1 and OC2 and the potential of the first node N1 is also increased due to the third transfer transistors MT13 and MT23 that were initially turned on. When the potential of the first node N1 rises to be equal to the active potential supplied by the second reference potential terminal VGH, the third transfer transistors MT13 and MT23 are turned off such that the increase in the potential of the first node N1 is limited. This can avoid a potential increase in the leakage current flowing from the first node N1 to the second scan level terminal CNB through the second transistor M2. Further, since the first node N1 is not in conduction with the internal nodes ND1 and ND2, the decrease in the potential of the first node N1 due to the leakage current does not affect the potentials of the internal nodes ND1 and ND2, thereby ensuring that the gate drive signals output from the output terminals OUT1 and OUT2 do not deteriorate. This is especially advantageous in high temperature scenarios where the leakage current significantly increases.

Figure 4:
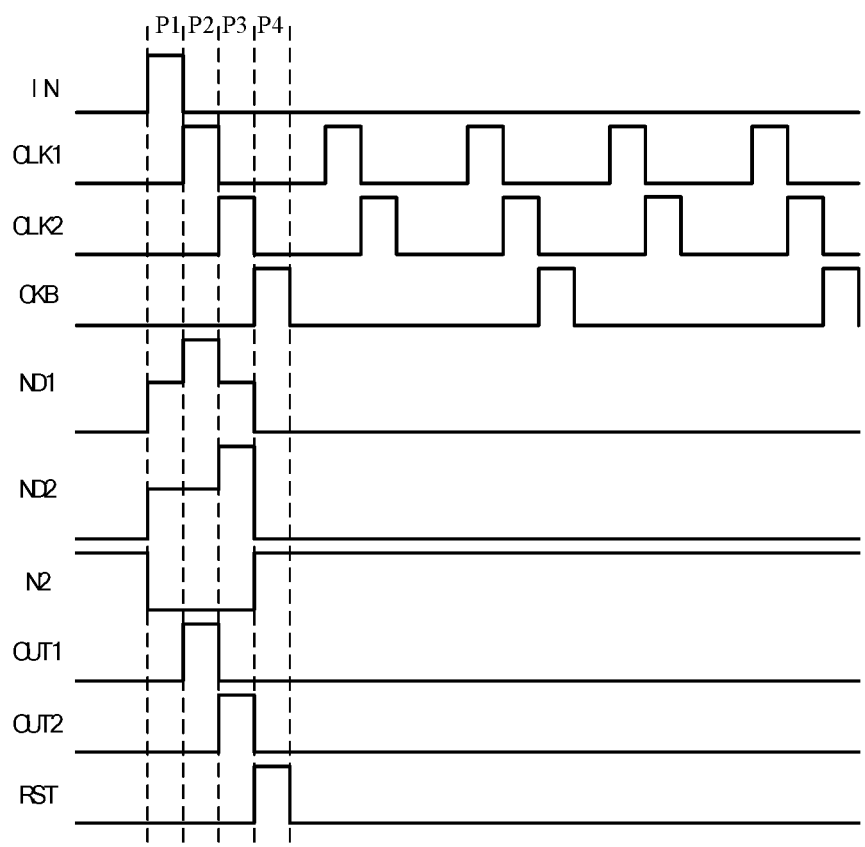
FIG. 4 is a timing diagram of the example circuit shown in FIG. 3 in a first operation mode.

FIG. 4 is a timing diagram of the example circuit 100B as shown in FIG. 3 in a first operation mode. The operation of the example circuit 100B of FIG. 3 is described below with reference to FIG. 4. In the following, a high level is indicated by 1 and a low level is indicated by 0. It is also assumed that the first scan level terminal CN and the second reference level terminal supply a high level voltage and the second scan level terminal CNB and the first reference level terminal VGL supply a low level voltage.

As shown in FIG. 4, in the first operation mode, the clock signals of the N clock terminals CLK1 and CLK2 supplied to the N output circuits (N=2 in this example) have the same period and a duty cycle of $1/(2N)$, and the n-th clock signal is delayed by $1/(2N)$ of the period with respect to the (n−1)-th clock signal, wherein n is an integer and $1 < n \leq N$.

In phase P1, IN=1, CLK1=0, CLK2=0, CKB=0, RST=0. The first transistor M1 is turned on and a high level voltage from the first scan level terminal CN is transferred to the first node N1 such that the first node N1 is set at an active potential (a high level in this example). The turned-on third transfer transistors MT13 and MT23 transfer the active potential of the first node N1 to the internal nodes ND1 and ND2 such that the first transfer transistors MT11 and MT21 are turned on. Inactive clock signals are transferred to the output terminals OUT1 and OUT2 through the first transfer transistors MT11 and MT21, respectively, such that the output terminals OUT1 and OUT2 are at an inactive potential (a low level in this example).

In phase P2, IN=0, CLK1=1, CLK2=0, CKB=0, RST=0. The output capacitors OC1 and OC2 hold the internal nodes ND1 and ND2 at an active potential such that the first transfer transistors MT11 and MT21 remain on. An active clock signal is transferred from the clock terminal CLK1 to the output terminal OUT1 such that the output terminal OUT1 is at an active potential. An inactive clock signal is transferred from the clock terminal CLK2 to the output terminal OUT2 such that the output terminal OUT2 is at an inactive potential. Due to the self-boosting effect of the output capacitor OC1, the potentials of the internal node ND1 and the first node N1 are further pulled up. As described above, when the potential of the first node N1 rises to be equal to the gate voltage VGH of the third transfer transistor MT13, the third transfer transistor MT13 is turned off, bringing the first node N1 and the internal node ND1 out of conduction.

In phase P3, IN=0, CLK1=0, CLK2=1, CKB=0, RST=0. An inactive clock signal is transferred from the clock terminal CLK1 to the output terminal OUT1 through the turned-on first transfer transistor MT11 such that the output terminal OUT1 is at an inactive potential. Due to the self-boosting effect of the output capacitor OC1, the potential of the internal node ND1 is pulled low but is still at an active potential. An active clock signal is transferred from the clock terminal CLK2 to the output terminal OUT2 through the turned-on first transfer transistor MT21 such that the output terminal OUT2 is at an active potential. Due to the self-boosting effect of the output capacitor OC2, the potentials of the internal node ND2 and the first node N1 are further pulled up. As described above, when the potential of the first node N1 rises to be equal to the gate voltage VGH of the third transfer transistor MT23, the third transfer transistor MT23 is turned off, bringing the first node N1 and the internal node ND2 out of conduction.

In phase P4, IN=0, CLK1=0, CLK2=0, CKB=1, RST=1. The second transistor T2 is turned on and a low level voltage from the second scan level terminal CNB is transferred to the first node N1 such that the first node N1 is set at an inactive potential. The fifth transistor M5 is turned on and an active potential from the reset hold terminal CKB is transferred to the second node N2 such that the second transfer transistors MT12 and MT22 are turned on and the first capacitor C1 is charged. A low level voltage from the first reference level terminal VGL is transferred to the output terminals OUT1 and OUT2 such that the output terminals OUT1 and OUT2 are at an inactive potential.

Thereafter, a reset hold signal from the reset hold terminal CKB periodically charges the first capacitor C1, holding the second node N2 at an active potential. The second transfer transistors MT12 and MT22 are held turned-on, and an inactive potential from the first reference level terminal VGL is transferred to the output terminals OUT1 and OUT2. Therefore, the output terminals OUT1 and OUT2 remain at an inactive potential.

Figure 5:
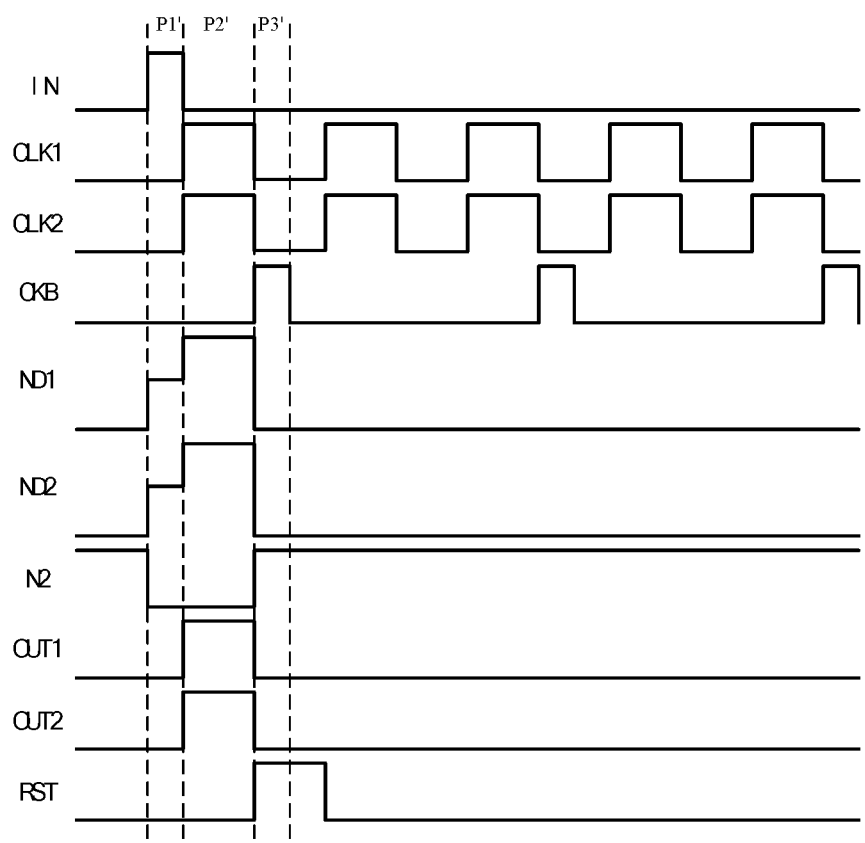
FIG. 5 is a timing diagram of the example circuit shown in FIG. 3 in a second operation mode.

FIG. 5 is a timing diagram of the example circuit 100B as shown in FIG. 3 in a second operation mode. The operation of the example circuit 100B of FIG. 3 is described below with reference to FIG. 5.

As shown in FIG. 5, in the second operation mode, the clock signals of the N clock terminals CLK1 and CLK2 supplied to the N output circuits (N=2 in this example) are identical.

In phase P1', IN=1, CLK1=0, CLK2=0, CKB=0, RST=0. The first transistor M1 is turned on and a high level voltage from the first scan level terminal CN is transferred to the first node N1 such that the first node N1 is set at an active potential. The turned-on third transfer transistors MT13 and MT23 transfer the active potential of the first node N1 to the internal nodes ND1 and ND2 such that the first transfer transistors MT11 and MT21 are turned on. Inactive clock signals are respectively transferred to the output terminals OUT1 and OUT2 through the first transfer transistors MT11 and MT21 such that the output terminals OUT1 and OUT2 are at an inactive potential.

In phase P2', IN=0, CLK1=1, CLK2=1, CKB=0, RST=0. The output capacitors OC1 and OC2 hold the internal nodes ND1 and ND2 at an active potential such that the first transfer transistors MT11 and MT21 remain on. The active clock signal is transferred from the clock terminal CLK1 to the output terminal OUT1 such that the output terminal OUT1 is at an active potential. An active clock signal is transferred from the clock terminal CLK2 to the output terminal OUT2 such that the output terminal OUT2 is at an active potential. Due to the self-boosting effect of the output capacitors OC1 and OC2, the potentials of the internal nodes ND1 and ND2 (and the first node N1) are further pulled high. When the potential of the first node N1 rises to be equal to the gate voltage VGH of the third transfer transistors MT13 and MT23, the third transfer transistors MT13 and MT23 are turned off, bringing the first node N1 and the internal nodes ND1 and ND2 out of conduction.

In phase P3', IN=0, CLK1=0, CLK2=0, CKB=1, RST=1. The second transistor T2 is turned on and a low level voltage from the second scan level terminal CNB is transferred to the first node N1 such that the first node N1 is set at an inactive potential. The fifth transistor M5 is turned on and an active potential from the reset hold terminal CKB is transferred to the second node N2 such that the second transfer transistors MT12 and MT22 are turned on and the first capacitor C1 is charged. A low level voltage from the first reference level terminal VGL is transferred to the output terminals OUT1 and OUT2 such that the output terminals OUT1 and OUT2 are at an inactive potential.

Thereafter, a reset hold signal from the reset hold terminal CKB periodically charges the first capacitor C1, holding the second node N2 at an active potential. The second transfer transistors MT12 and MT22 are held turned-on, and an inactive potential from the first reference level terminal VGL is transferred to the output terminals OUT1 and OUT2. Therefore, the output terminals OUT1 and OUT2 remain at an inactive potential.

Figure 6:
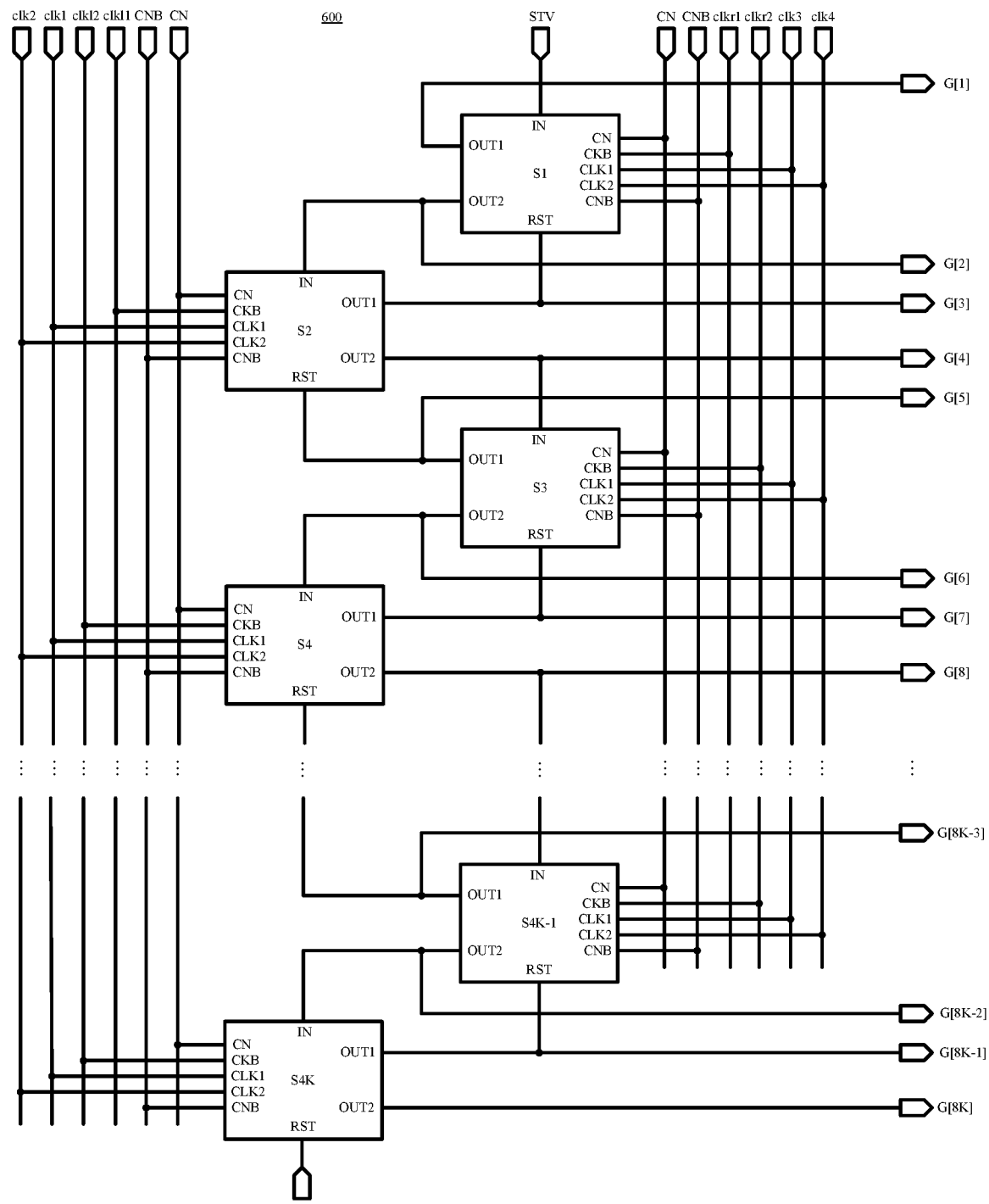
FIG. 6 is a block diagram of a gate drive circuit according to an embodiment of the present disclosure.

FIG. 6 is a block diagram of a gate drive circuit 600 according to an embodiment of the present disclosure. Referring to FIG. 6, the gate drive circuit 600 includes a plurality of cascaded shift register unit circuits S1, S2, S3, S4 . . . S4K−1, S4K (K being a positive integer), and each of the shift register unit circuits is illustrated as having two clock terminals CLK1 and CLK2 and two output terminals OUT1 and OUT2. The shift register unit circuits S1, S2, S3, S4 . . . S4K–1, S4K operate together to provide gate lines G[3], G[4], G[5], G[4], G[5], G[4] G[7], G[8] . . . G[8K–3], G[8K–2], G[8K–1], G[8K] with respective gate drive signals. Each of these shift register unit circuits may be the shift register unit circuit 100 as described above. More generally, each of the shift register unit circuits may be described as having N clock terminals and N outputs (N being an integer greater than or equal to 2).

As shown in FIG. 6, except for the shift register unit circuit S1, the input terminal IN of each of the plurality of shift register unit circuits is connected to the last one of the N output terminals of the adjacent previous shift register unit circuit (OUT2 in the example of FIG. 6). Except for the shift register unit circuit S4K, the reset terminal RST of each of the plurality of shift register unit circuits is connected to the first one of the N output terminals of the adjacent next shift register unit circuit (OUT1 in the example of FIG. 6). The N clock terminals of the (2k–1)-th (k being a positive integer) one of the plurality of shift register unit circuits are configured to receive their respective clock signals from a first group of clock lines including N clock lines (clk3 and clk4 in the example of FIG. 6). The N clock terminals of the 2k-th one of the plurality of shift register unit circuits are configured to receive their respective clock signals from a second group of clock lines including N clock lines (clk1 and clk2 in the example of FIG. 6). In addition, the reset hold terminals CKB of the (4k–3)-th, (4k–2)-th, (4k–1)-th and 4k-th shift register unit circuits receive the reset hold signal from the reset hold signal lines clkr1, clkl1, clkr2 and clkl2, respectively.

In the example of FIG. 6, the gate drive circuit 600 is configured to operate in a forward scan mode in which a start pulse STV is applied to the first shift register unit circuit S1. Although not shown, the gate drive circuit 600 may also be configured to operate in a reverse scan mode in which a start pulse is applied to the last shift register unit circuit S4K. It will be understood that, depending on the scan direction, the input terminal IN and the reset terminal RST of the shift register unit circuit may be used interchangeably and the first scan level terminal CN and the second scan level terminal CNB may be used interchangeably. In the forward scan mode, the first scan level terminal CN supplies an active level voltage, the second scan level terminal CNB supplies an inactive level voltage, and the input terminal IN and the reset terminal RST are normally used. In the reverse scan mode, the first scan level terminal CN supplies an inactive level voltage, and the second scan level terminal CNB supplies an active level voltage. In this case, the input terminal IN functions as a "reset terminal" and the reset terminal RST functions as an "input terminal".

In addition, while the gate drive circuit 600 is illustrated as including an integer multiple of four shift register unit circuits and each of the shift register unit circuits is illustrated as having two clock terminals and two output terminals, the present disclosure is not limited thereto.

Figure 7:
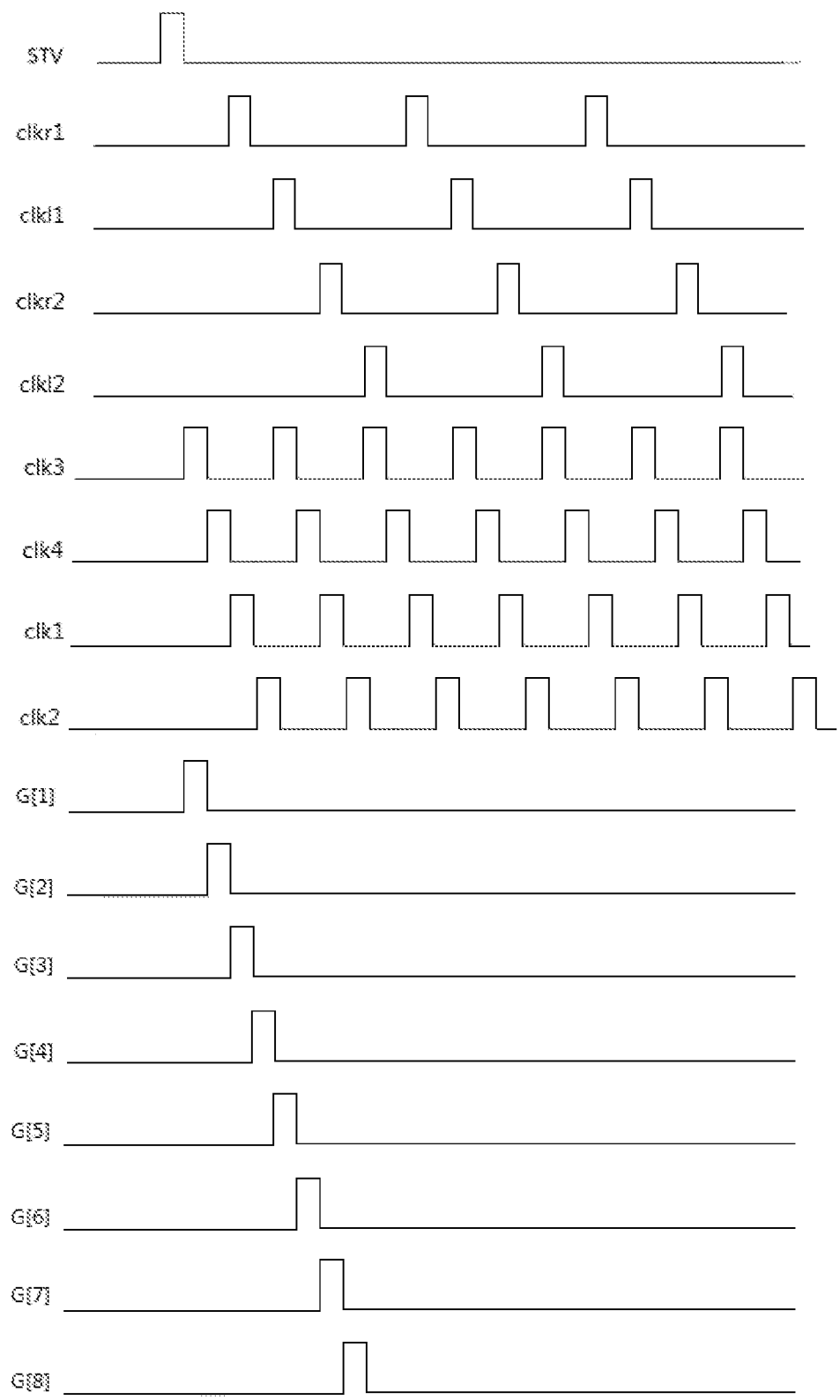
FIG. 7 is a timing diagram of the gate drive circuit as shown in FIG. 6 in the first operation mode.

FIG. 7 is a timing diagram of the gate drive circuit 600 as shown in FIG. 6 in the first operation mode. In the first operation mode, the N clock signals applied to the N clock terminals of each of the shift register unit circuits have a duty cycle of 1/(2N) (N=2 in this example), and the n-th one (e.g., clk4 or clk2) of the N clock signals is delayed by 1/(2N) period with respect to the (n–1)-th one (e.g., clk3 or clk1) of the N clock signals (n being an integer and 1<n≤N).

As shown in FIG. 7, the first group of clock signals (clk3 and clk4) and the second group of clock signals (clk1 and clk2) have the same period, and each of the second group of clock signals is delayed by 1/N of the period with respect to a corresponding one of the first group of clock signals. For example, clk1 is delayed by 1/N of the period with respect to clk3, and clk2 is delayed by 1/N of the period with respect to clk4. The operations of the respective shift register unit circuits are the same as those described above with respect to FIG. 4, and are omitted here for conciseness. The resulting gate drive signals are shown in FIG. 7. For ease of illustration, only the gate driving signals G[1], G[2], G[3], G[4], G[5], G[6], G[7], and G[8] generated by the first four shift register unit circuits are shown in FIG. 7.

Figure 8:
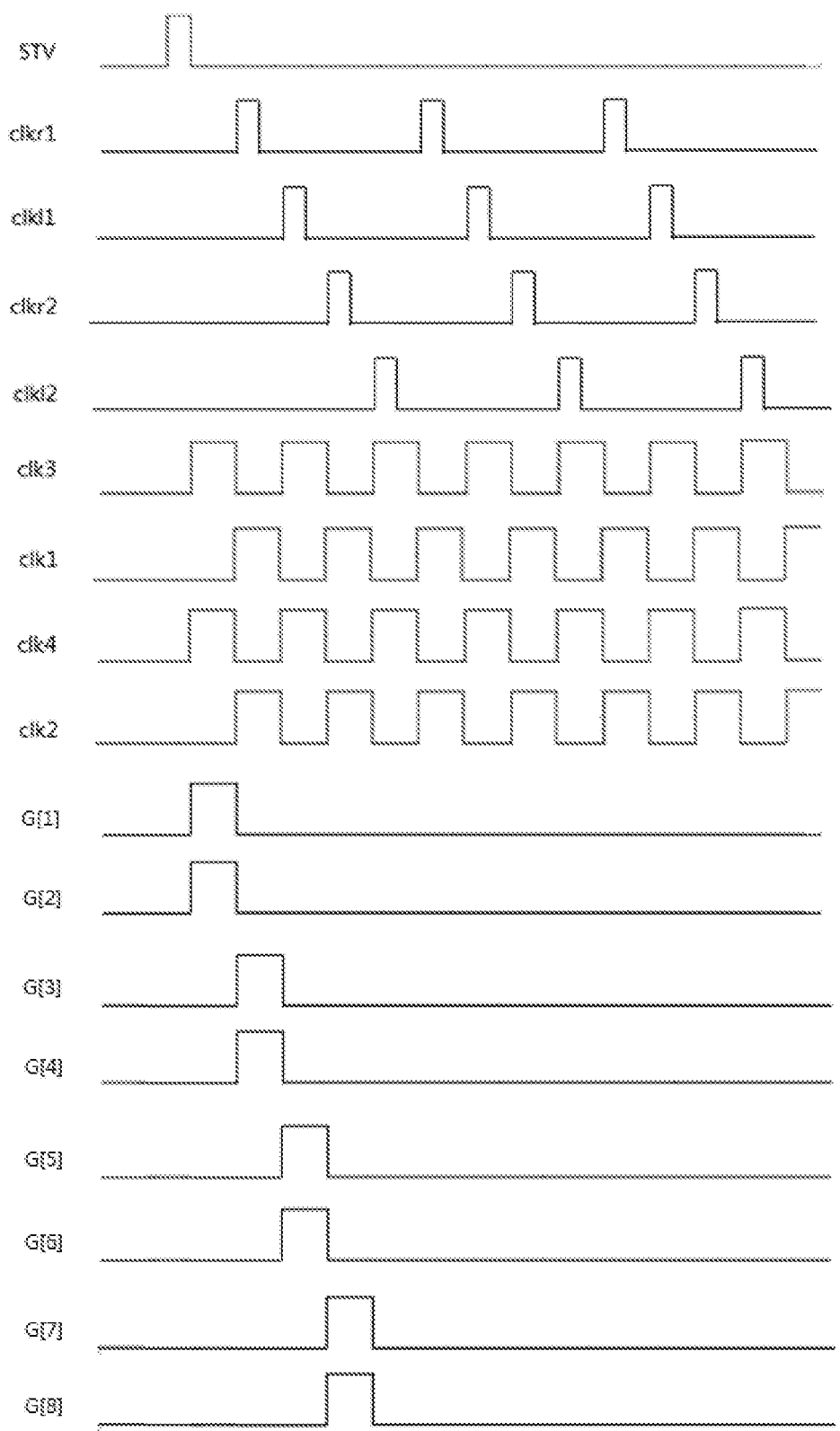
FIG. 8 is a timing diagram of the gate drive circuit as shown in FIG. 6 in the second operation mode.

FIG. 8 is a timing diagram of the gate drive circuit 600 as shown in FIG. 6 in the second operation mode. In the second operation mode, the N clock signals applied to the N (N=2 in this example) clock terminals of each of the shift register unit circuits are identical.

As shown in FIG. 8, the first group of clock signals (clk3 and clk4) and the second group of clock signals (clk1 and clk2) have the same period, and each of the second group of clock signals is delayed by 1/N of the period with respect to a corresponding one of the first group of clock signals. For example, clk1 is delayed by 1/N of the period with respect to clk3, and clk2 is delayed by 1/N of the period with respect to clk4. The operation of the respective shift register unit circuits are the same as those described above with respect to FIG. 5, and is omitted here for conciseness. The resulting gate drive signals are shown in FIG. 8. For ease of illustration, only the gate driving signals G[1], G[2], G[3], G[4], G[5], G[6], G[7], and G[8] generated by the first four shift register unit circuits are shown in FIG. 8.

The second operation mode may be advantageous in that the N gate drive signals generated by each of the shift register unit circuits are synchronized, as shown in FIG. 8, which means that N rows of pixels can be scanned (i.e., supplied with data signals) simultaneously and thus provide a higher refresh rate. This may lead to an improved display effect.

Figure 9:
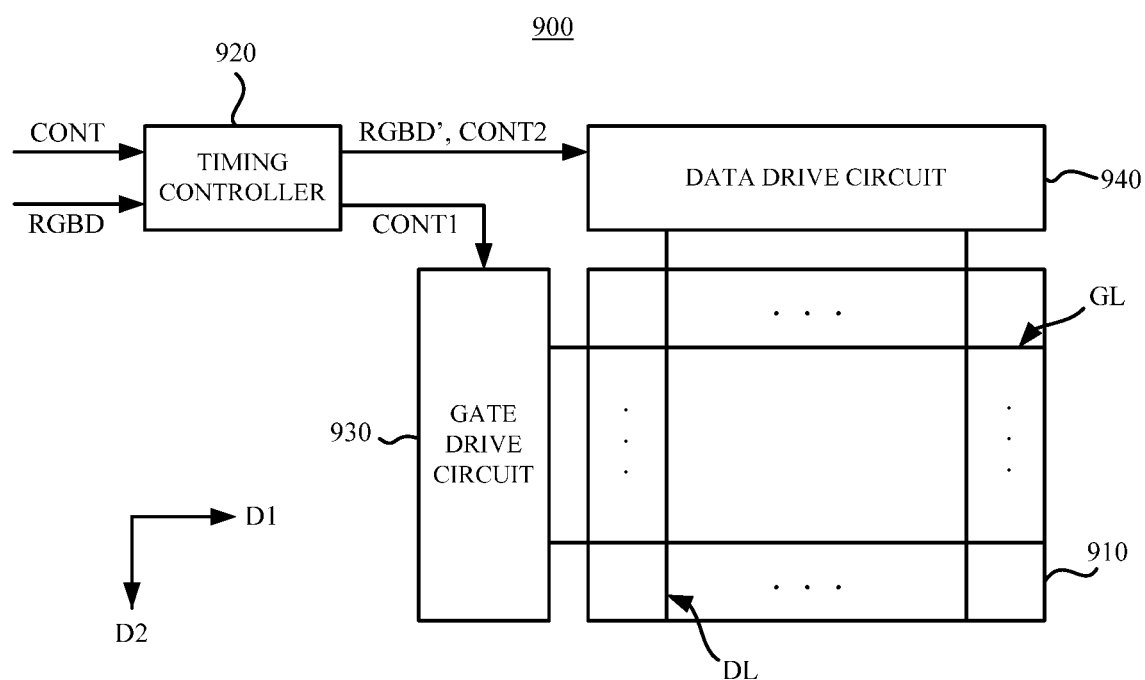
FIG. 9 is a block diagram of a display apparatus according to an embodiment of the present disclosure.

FIG. 9 is a block diagram of a display apparatus 900 according to an embodiment of the present disclosure. Referring to FIG. 9, the display apparatus 900 includes a display panel 910, a timing controller 920, a gate drive circuit 930, and a data drive circuit 940. The gate drive circuit 930 may be the gate drive circuit 600 described above with respect to FIG. 6.

The display panel 910 is connected to a plurality of gate lines GL and a plurality of data lines DL. The display panel 910 displays an image having a plurality of grayscales based on output image data RGBD'. The gate lines GL may extend in a first direction D1 and the data lines DL may extend in a second direction D2 that intersects (e.g., is substantially perpendicular to) the first direction D1. The display panel 910 may include a plurality of pixels (not shown) arranged in a matrix. Each of the pixels may be electrically connected to a respective one of the gate lines GL and a respective one of the data lines DL. The display panel 910 may be a liquid crystal display panel, an organic light emitting diode (OLED) display panel, or any other suitable type of display panel.

The timing controller 920 controls the operations of the display panel 910, the gate drive circuit 930, and the data drive circuit 940. The timing controller 920 receives input image data RGBD and input control signals CONT from an external device, for example, a host. The input image data RGBD may include a plurality of input pixel data for a plurality of pixels. Each of the input pixel data may include red, green, and blue grayscale data R, G, and B for a respective one of the plurality of pixels. The input control signals CONT may include a main clock signal, a data enable signal, a vertical synchronization signal, a horizontal synchronization signal, and the like. The timing controller 920 generates the output image data RGBD', a first control signal CONT1, and a second control signal CONT2 based on the input image data RGBD and the input control signals CONT.

The gate drive circuit 930 receives the first control signal CONT1 from the timing controller 920. The gate drive circuit 930 generates a plurality of gate signals for driving the gate lines GL based on the first control signals CONT1. The gate drive circuit 930 may sequentially apply the plurality of gate signals to the gate lines GL.

The data drive circuit 940 receives the second control signal CONT2 and the output image data RGBD' from the timing controller 920. The data drive circuit 940 generates a plurality of data voltages (e.g., analog data voltages) based on the second control signal CONT2 and the output image data RGBD' (e.g., digital image data). The data drive circuit 940 may apply the plurality of data voltages to the data lines DL.

In some exemplary embodiments, the gate drive circuit 930 and/or the data drive circuit 940 may be disposed (e.g., mounted directly) on the display panel 910 or may be connected to the display panel 910 by way of, for example, a Tape Carrier Package (TCP). In some embodiments, the gate drive circuit 930 and/or the data drive circuit 940 may be integrated in the display panel 910.

Examples of the display apparatus 900 include, but are not limited to, a mobile phone, a tablet, a television, a display, a notebook, a digital photo frame, or a navigator.

It will be understood that in various embodiments, while the transistors are illustrated and described as n-type transistors, p-type transistors are possible. In the case of a p-type transistor, the gate-on voltage has a low level and the gate-off voltage has a high level. In various embodiments, the transistors may, for example, be thin film transistors, which are typically fabricated such that their first and second electrodes are used interchangeably. Other embodiments are also contemplated.

The foregoing are preferred embodiments of the present disclosure. It should be noted that various improvements and modifications can be made by those skilled in the art without departing from the principle of the disclosure. These improvements and modifications should be regarded as fall within the scope of the present disclosure.

What is claimed is:

1. A shift register unit circuit, comprising:
a first node control circuit configured to supply an active potential from a first scan level terminal to a first node in response to an input pulse from an input terminal being active, to supply an inactive potential from a second scan level terminal to the first node in response to a reset pulse from a reset terminal being active, and to supply an inactive potential from a first reference level terminal to the first node in response to a second node being at an active potential;
a second node control circuit configured to supply an inactive potential from the first reference level terminal to the second node in response to the first node being at an active potential, and to set the second node at an active potential in response to the first node being at an inactive potential and a reset hold signal from a reset hold terminal being active, wherein the reset hold terminal and the second node tare in conduction with each other when the reset hold signal is active, such that the reset hold signal is transferred from the reset hold terminal to the second node to set the second node at an active potential; and
N output circuits each directly connected to a respective internal node, a respective clock terminal and a respective output terminal, the respective internal node being electrically connected to the first node, N being an integer greater than or equal to 2,
wherein each of the N output circuits is configured to supply a clock signal from the respective clock terminal to the respective output terminal in response to the respective internal node being at an active potential, to supply an inactive potential from the first reference level terminal to the respective output terminal in response to the second node being at an active potential, and to cause a change in the potential of the respective internal node in response to a change in the potential of the respective output terminal,
wherein the second node control circuit comprises: a first transistor having a gate directly connected to the first node, a first electrode directly-connected to the first reference level terminal, and a second electrode directly connected to the second node; a second transistor having a gate directly connected to the reset hold terminal, a first electrode directly connected to the reset hold terminal, and a second electrode directly connected to the second node; and a first capacitor directly connected between the second node and the first reference level terminal.

2. The shift register unit circuit of claim 1, wherein each of the N output circuits comprises:
a first transfer transistor having a gate directly connected to the respective internal node, a first electrode directly connected to the respective output terminal, and a second electrode directly connected to the respective clock terminal;
a second transfer transistor having a gate directly connected to the second node, a first electrode directly connected to the first reference level terminal, and a second electrode directly connected to the respective output terminal; and
an output capacitor directly connected between the respective internal node and the respective output terminal.

3. The shift register unit circuit of claim 1, wherein the first node control circuit comprises:
a third transistor having a gate directly connected to the input terminal, a first electrode directly connected to the first node, and a second electrode directly connected to the first scan level terminal;
a fourth transistor having a gate directly connected to the reset terminal, a first electrode directly connected to the second scan level terminal, and a second electrode directly connected to the first node; and
a fifth transistor having a gate directly connected to the second node, a first electrode directly connected to the first node, and a second electrode directly connected to the first reference level terminal.

4. The shift register unit circuit of claim 1, wherein the internal node of each of the N output circuits is directly connected to the first node.

5. A gate drive circuit comprising a plurality of cascaded shift register unit circuits as claimed in claim 1, wherein
except for a first one of the plurality of shift register unit circuits, the input terminal of each of the plurality of shift register unit circuits is directly connected to a last one of the N output terminals of an adjacent previous one of the shift register unit circuits;

except for a last one of the plurality of shift register unit circuits, the rest terminal of each of the plurality of shift register unit circuits is directly connected to a first one of the N output terminals of an adjacent next one of the shift register unit circuits;

the N clock terminals of a (2k−1)-th one of the plurality of shift register unit circuits are configured to receive respective clock signals from a first group of clock lines including N clock lines, k being a positive integer; and the N clock terminals of a 2k-th one of the plurality of shift register unit circuits are configured to receive respective clock signals from a second group of clock lines including N clock lines, the clock signals supplied by the first and second groups of clock lines having a same period, each of the clock signals supplied by the second group of clock lines being delayed by 1/N of the period with respect to a corresponding one of the clock signals supplied by the first group of clock lines.

6. The gate drive circuit of claim 5, wherein the gate drive circuit is configured with a first operation mode where the N clock signals received at the N clock terminals of each of the plurality of shift register unit circuits have a duty cycle of 1/(2N) and an n-th one of the N clock signals is delayed by 1/(2N) of the period with respect to an (n−1)-th one of the N clock signals, n being an integer and $1<n\leq N$.

7. The gate drive circuit of claim 5, wherein the gate drive circuit is configured with a second operation mode where the N clock signals received at the N clock terminals of each of the plurality of shift register unit circuits are identical.

8. A display apparatus comprising the gate drive circuit as claimed in claim 5.

9. A display apparatus comprising the gate drive circuit as claimed in claim 6.

10. A display apparatus comprising the gate drive circuit as claimed in claim 7.

* * * * *